(12) United States Patent  
Shigihara

(10) Patent No.: US 9,008,141 B2  
(45) Date of Patent: Apr. 14, 2015

(54) SEMICONDUCTOR LASER DEVICE

(71) Applicant: Mitsubishi Electric Corporation, Tokyo (JP)

(72) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/178,346

(22) Filed: Feb. 12, 2014

(65) Prior Publication Data

US 2015/0023380 A1    Jan. 22, 2015

(30) Foreign Application Priority Data

Jul. 19, 2013  (JP) .................................. 2013-150741

(51) Int. Cl.
*H01S 5/00* (2006.01)
*H01S 5/22* (2006.01)
*H01S 5/20* (2006.01)

(52) U.S. Cl.
CPC ............... *H01S 5/222* (2013.01); *H01S 5/2031* (2013.01)

(58) Field of Classification Search
CPC ....... H01S 5/2018; H01S 5/222; H01S 5/223; H01S 5/2231; H01S 5/2232; H01S 5/227
USPC ........................................... 372/45.01, 46.01
See application file for complete search history.

(56) References Cited

U.S. PATENT DOCUMENTS

| 2001/0009558 A1* | 7/2001 | Shigihara ........................ 372/45 |
| 2002/0071465 A1 | 6/2002 | Sonobe et al. |
| 2009/0080484 A1* | 3/2009 | Shigihara ................... 372/46.01 |

FOREIGN PATENT DOCUMENTS

| JP | 11-233882 A | 8/1999 |
| JP | 2002-94188 A | 3/2002 |

OTHER PUBLICATIONS

Alam et al.; "Simple Analysis of Carrier Transport and Buildup in Separate Confinement Heterostructure Quantum Well Lasers, *IEEE Photonics Tech. Ltrs.*", vol. 6, No. 12, pp. 1418-1420, (Dec. 1994).
Iga et al.; "Semiconductor Laser", *Ohmsha*, pp. 34-39, (1994).
S. Kawakami; "Light Guide", *Asakura Publishing Co., Ltd.*, pp. 18-25, (1980).

* cited by examiner

*Primary Examiner* — Yuanda Zhang
(74) *Attorney, Agent, or Firm* — Leydig, Voit & Mayer, Ltd.

(57) ABSTRACT

A semiconductor laser device includes a first conductivity type semiconductor substrate, a first conductivity type cladding layer, a first light guide layer, an active layer, a second light guide layer, and a second conductivity type cladding layer laminated on the semiconductor substrate in that order. The semiconductor laser device supports at least one of a first-order and higher-order mode of oscillation in the semiconductor laser in crystal growth direction of the active layer. The first light guide layer is thicker than the second light guide layer. A first conductivity type low refractive index layer having a lower refractive index than refractive index of the first conductivity type cladding layer, is disposed between the first conductivity type cladding layer and the first light guide layer. The refractive index of the second light guide layer is higher than the refractive index of the first light guide layer.

1 Claim, 14 Drawing Sheets

DISPLACEMENT OF ACTIVE LAYER POSITION P (nm)

DISPLACEMENT OF ACTIVE LAYER POSITION P (nm)

SEMICONDUCTOR LASER DEVICE

BACKGROUND OF THE INVENTION

1. Field of the Invention

The present invention relates to a semiconductor laser device.

2. Background Art

Conventionally, as disclosed, for example, in Japanese Patent Laid-Open No. 2002-94188 and Japanese Patent Laid-Open No. 11-233882 below, semiconductor laser devices are known which have various improved optical characteristics such as light intensity distribution and light confinement.

Japanese Patent Laid-Open No. 11-233882 discloses a semiconductor laser device including a conductive clad layer, a light guide layer and a low refractive index layer having a lower refractive index than that of the conductive clad layer interposed between the conductive clad layer and the light guide layer. This makes it possible to expand a light intensity distribution in a crystal growth direction and consequently narrow a far-field pattern (FFP) thereof.

Japanese Patent Laid-Open No. 2002-94188 discloses a semiconductor laser device that increases light confinement of light confined in an active layer by making the refractive index of a p-side light guide layer higher than the refractive index of an n-side light guide layer.

However, it is difficult for conventional semiconductor laser devices to increase power conversion efficiency for achieving both a reduction of a threshold current and an improvement of slope efficiency. The present inventor made every effort to research a semiconductor laser device that allows a high-order mode equal to or higher than a first order mode in a crystal growth direction, and came to discover a semiconductor laser device capable of achieving both a reduction of a threshold current and an improvement of slope efficiency.

SUMMARY OF THE INVENTION

The present invention has been implemented to solve the above-described problem and it is an object of the present invention to provide a semiconductor laser device having high power conversion efficiency.

According to one aspect of the present invention, a semiconductor laser device includes a first conductive semiconductor substrate, a first conductive clad layer laminated on the semiconductor substrate, a first light guide layer laminated on the first conductive clad layer, an active layer laminated on the first light guide layer, a second light guide layer laminated on the active layer, and a second conductive clad layer laminated on the second light guide layer, wherein a first-order or higher-order mode is allowed in a crystal growth direction. A layer thickness of the first light guide layer is greater than a layer thickness of the second light guide layer. A first conductive low refractive index layer having a lower refractive index than a refractive index of the first conductive clad layer is provided between the first conductive clad layer and the first light guide layer. A refractive index of the second light guide layer is higher than a refractive index of the first light guide layer.

Other and further objects, features and advantages of the invention will appear more fully from the following description.

DETAILED DESCRIPTION OF THE PREFERRED EMBODIMENTS

Analysis by the Present Inventor

Hereinafter, considerations of the present inventor regarding the prior arts (Japanese Patent Laid-Open No. 11-233882 and Japanese Patent Laid-Open No. 2002-94188 in particular) will be described with reference to FIG. 12 to FIG. 14.

Japanese Patent Laid-Open No. 11-233882 describes a semiconductor laser device with a first low refractive index layer interposed between a first conductive clad layer and a first light guide layer, the first low refractive index layer having a lower refractive index than that of the first conductive clad layer. This expands a light intensity distribution in a crystal growth direction and consequently narrows a far-field pattern (FFP) thereof.

Figure 12:
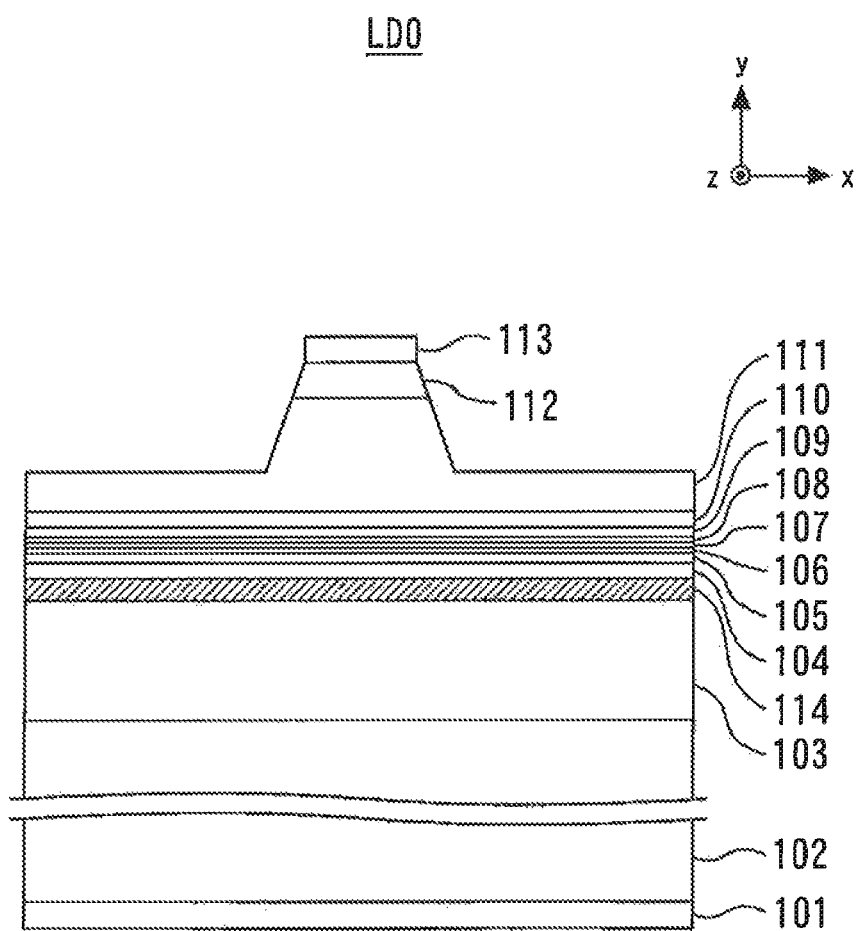
FIG. 12 is a diagram illustrating a structure of a conventional semiconductor laser device.

FIG. 12 is a diagram illustrating a structure considered by the present inventor regarding the description of Japanese Patent Laid-Open No. 11-233882.

In FIG. 12, a semiconductor laser device LD0 is provided with an n-type electrode 101 and an n-type GaAs substrate 102. On the n-type GaAs substrate 102, an n-type AlGaAs clad layer 103, an n-side AlGaAs light guide layer 104, an n-side AlGaAs barrier layer 105, an InGaAs quantum well active layer 106, an AlGaAs barrier layer 107, an InGaAs quantum well active layer 108, a p-side AlGaAs barrier layer 109, a p-side AlGaAs light guide layer 110, a p-type AlGaAs clad layer 111, a p-type GaAs contact layer 112, and a p-type electrode 113 are laminated in that order.

An n-type AlGaAs low refractive index layer 114 having an Al composition ratio of 0.50 and a layer thickness of t1 is provided between the n-type AlGaAs clad layer 103 and the n-side AlGaAs light guide layer 104. The reference character "t1" is a parameter.

The n-type AlGaAs clad layer 103 has an Al composition ratio of 0.250 and a layer thickness of 1.5 µm. The n-side AlGaAs light guide layer 104 has an Al composition ratio of 0.183 and a layer thickness of 50 nm. The n-side AlGaAs barrier layer 105 has an Al composition ratio of 0.100 and a layer thickness of 10 nm.

The InGaAs quantum well active layer 106 has an In composition ratio of 0.138 and a layer thickness of 8 nm. The AlGaAs barrier layer 107 has an Al composition ratio of 0.100 and a layer thickness of 3 nm. The InGaAs quantum well active layer 108 has an In composition ratio of 0.138 and a layer thickness of 8 nm. The p-side AlGaAs barrier layer 109 has an Al composition ratio of 0.100 and a layer thickness of 10 nm.

The p-side AlGaAs light guide layer 110 has an Al composition ratio of 0.183 and a layer thickness of 50 nm. The p-type AlGaAs clad layer 111 has an Al composition ratio of 0.250 and a layer thickness of 1.5 µm. The p-type GaAs contact layer 112 has a layer thickness of 0.2 µm.

The wavelength of light oscillated from the InGaAs quantum well active layers 106 and 108 is 980 nm.

FIG. 12 shows xyz coordinate axes, the y-axis being an axis parallel to the crystal growth direction of the semiconductor laser device LD0, the x-axis being an axis parallel to a surface direction of each semiconductor layer and the z-axis being an axis parallel to a laser light emission direction. End faces of a resonator of the semiconductor laser device LD0 are provided on the front side and on the back side of the surface of the sheet in FIG. 12 and the z-axis is also a length direction of the resonator.

Figure 13A:
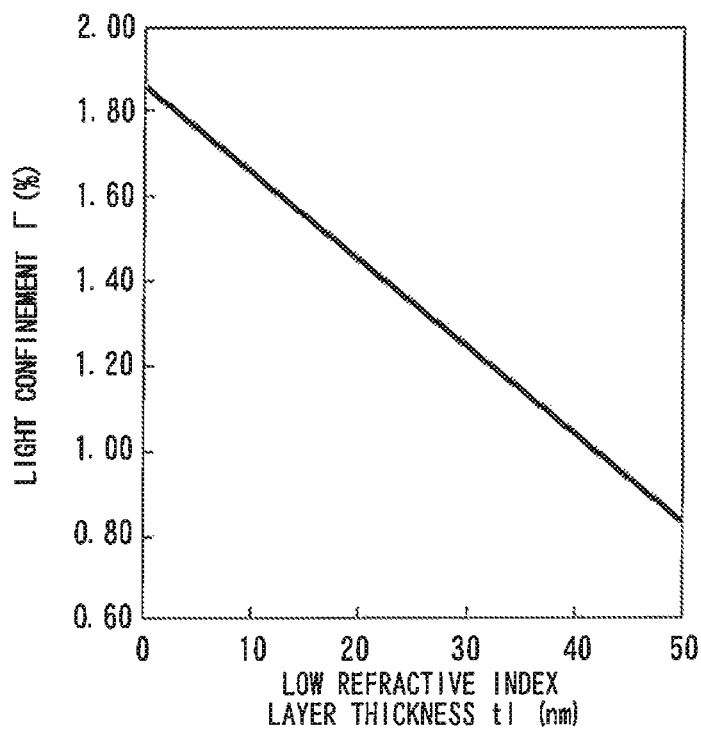
FIG. 13A illustrates a dependency of light confinement in an active layer on a layer thickness of the low refractive index layer and FIG. 13B illustrates dependency of a full width at half maximum ($\theta y$) in a crystal growth direction FFP on the layer thickness of the low refractive index layer.
Figure 13B:
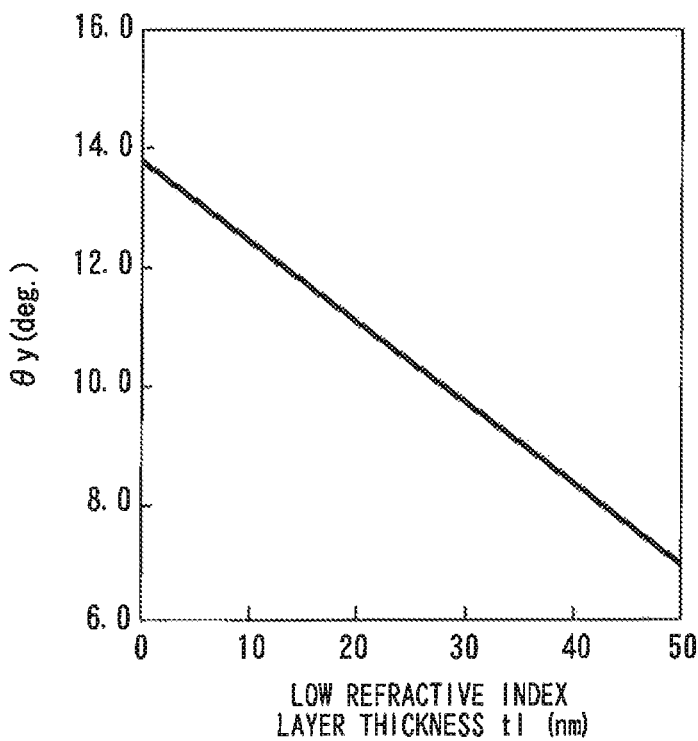

FIG. 13A illustrates a dependency of light confinement in an active layer on a layer thickness of the low refractive index layer and FIG. 13B illustrates dependency of a full width at half maximum (θy) in a crystal growth direction FFP on the layer thickness of the low refractive index layer. It is clear from FIG. 13A that the light confinement in the active layer monotonously decreases as the layer thickness of the low refractive index layer increases.

Furthermore, it is also clear from FIG. 13B that the full width at half maximum (θy) of the crystal growth direction FFP monotonously decreases as the layer thickness of the low refractive index layer increases. This means that the light intensity distribution which is a near-field pattern (NFP) of the crystal growth direction expands as the layer thickness of the low refractive index layer increases.

On the other hand, Japanese Patent Laid-Open No. 2002-94188 describes a semiconductor laser device that increases light confinement in an active layer by making the refractive index of a p-side light guide layer higher than that of an n-side light guide layer.

Suppose the configuration of the semiconductor laser device described in Japanese Patent Laid-Open No. 2002-94188 is combined with the configuration of the semiconductor laser device according to Japanese Patent Laid-Open No. 11-233882. According to the findings of the present inventor, this will cause the light intensity distribution of NFP to expand and consequently cause the light confinement to decrease. In addition, it is not possible to achieve an improvement of multimodality of FFP, which is one of objects of Japanese Patent Laid-Open No. 2002-94188. This is attributable to the fact that the technique disclosed in Japanese Patent Laid-Open No. 11-233882 is intended to expand NFP.

Furthermore, as described in "M. Alam and M. Lundstrom, "Simple Analysis of Carrier Transport and Buildup in Separate Confinement Heterostructure Quantum Well Lasers" IEEE, Photonics Tecnol. Lett., Vol. 6, No. 12, pp. 1418-1420, 1994," the gradient of a carrier distribution in a p-side light guide layer is $\mu n/\mu p$ times greater than the gradient of a carrier distribution in an n-side light guide layer. The symbol $\mu n$ refers to mobility of electrons and $\mu p$ refers to mobility of positive holes.

Figure 14:
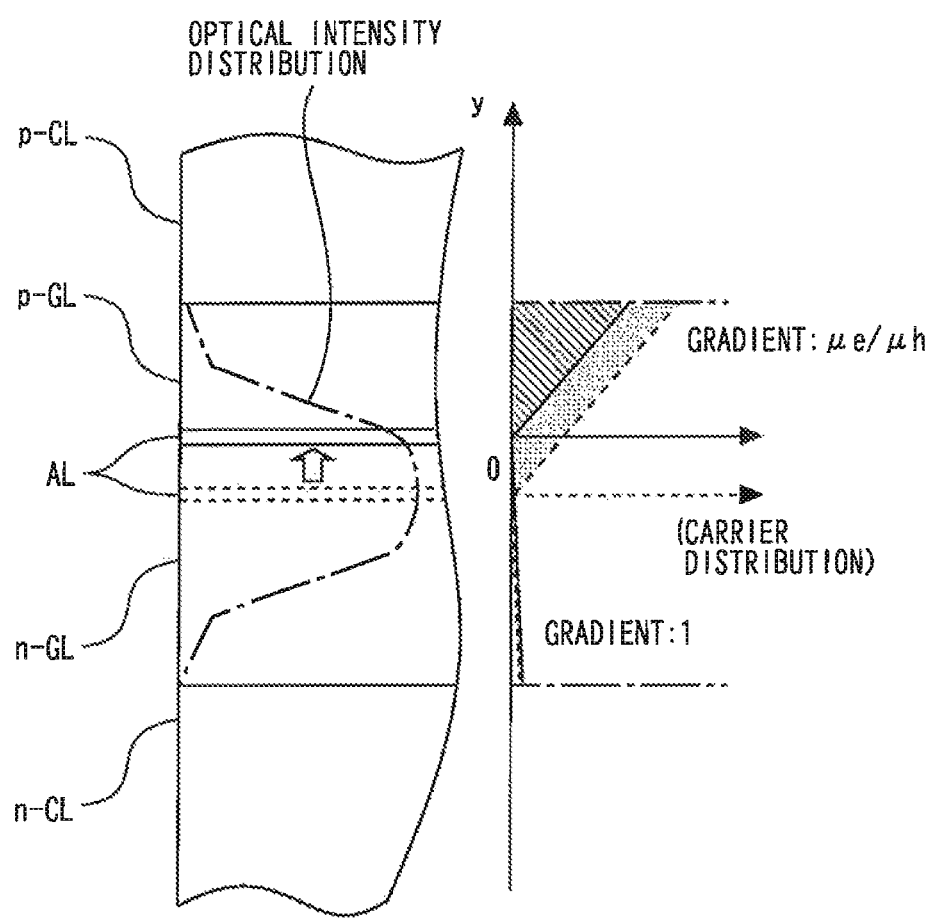
FIG. 14 is a diagram illustrating a carrier distribution and a light intensity distribution of carriers resident in a light guide layer of a semiconductor laser device.

FIG. 14 is a diagram illustrating a carrier distribution and a light intensity distribution of carriers resident in a light guide layer of a semiconductor laser device. FIG. 14 illustrates a light intensity distribution and a carrier distribution in a laminated structure of a p-side light guide layer p-GL and an n-side light guide layer n-GL that sandwich an active layer AL, and a p-type clad layer p-CL and an n-type clad layer n-CL that further sandwich these layers respectively.

The number of carriers becomes the smallest in the light guide layer in the vicinity of the active layer AL. When the position of the active layer AL as shown by an arrow in FIG. 14 is displaced toward the p-type clad layer p-CL side, the number of carriers in the light guide layer decreases. This difference can also be understood from a comparison between a carrier distribution (broken line) before the transfer of the active layer AL position and a carrier distribution (solid line) after the transfer of the active layer AL position in a carrier distribution graph on the right side of FIG. 14. As a result, carrier absorption of laser light decreases and it is possible to prevent slope efficiency from reducing. Particularly, when the light guide layer is thick, many carriers reside in the light guide layer during laser oscillation, and therefore such a phenomenon becomes noticeable in a semiconductor laser device having a thick light guide layer.

However, the peak position of the NFP light intensity distribution lies in the center of layer thickness of the combined n-side light guide layer n-GL and p-side light guide layer p-GL. For this reason, when the position of the active layer AL is displaced toward the p-type clad layer p-CL side, light confinement in the active layer AL decreases, causing an increase in a threshold current. When the ratio of the threshold current to the operating current is small, it is effective to displace the position of the active layer AL toward the p-type clad layer p-CL side.

In the above-described conventional semiconductor laser device LD0, suppose a low refractive index layer having a lower refractive index than that of the n-type clad layer is inserted in the n-type clad layer and the n-side guide layer. Then, the light intensity distribution of NFP expands in the crystal growth direction and light confinement in the active layer decreases, leading to an increase in the threshold current.

In the above-described conventional semiconductor laser device LD0, when the active layer position is displaced from the "center position of the total light guide layer structure" toward the p-type clad layer side, the slope efficiency can be improved. However, although the slope efficiency can be improved, the displacement may result in an increase in the threshold current. The "center position" of the total light guide layer structure referred to here is a position corresponding to the lateral center plane of the light guiding layer structure, that is half the total light guide layer structure thickness.

The "total light guide layer structure thickness" is the sum of the layer thickness of the n-side light guide layer, the layer thickness of the active layer, and the layer thickness of the p-side light guide layer. The lateral center plane of the light guiding layer structure is indicated by a dashed line in FIG. 1 and FIGS. 4, 6, 8, and 10 described later, and the active layer position P is located in this plane when the layer thickness of the n-side light guide layer is equal to the layer thickness of the p-side light guide layer.

In this way, it is difficult for the conventional semiconductor laser device LD0 to increase power conversion efficiency for achieving both a reduction in the threshold current and an improvement of slope efficiency. In this respect, according to a semiconductor laser device according to an embodiment of the present invention, which will be described later, it is possible to increase power conversion efficiency for achieving both a reduction in the threshold current and an improvement of slope efficiency.

First Embodiment

Figure 1:
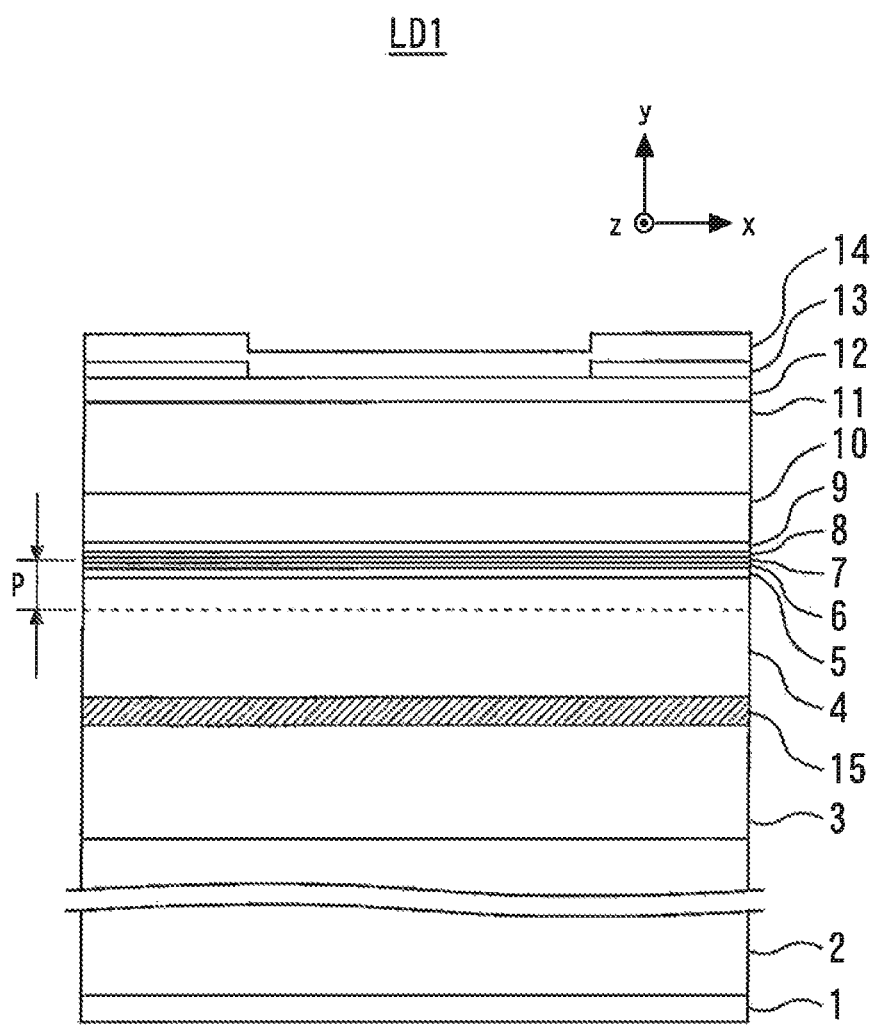
FIG. 1 is a diagram for illustrating operations and effects in a semiconductor laser device by inserting a low refractive index layer which becomes a premise of a first embodiment of the present invention.

Operation and Effect when Low Refractive Index Layer According to First Embodiment is Inserted FIG. 1 is a diagram for illustrating operations and effects in a semiconductor laser device by inserting a low refractive index layer which becomes a premise of a first embodiment of the present invention. FIG. 1 is a cross-sectional view of a semiconductor laser device LD1 and the semiconductor laser device LD1 is provided with an n-type GaAs substrate 2 provided with an n-type electrode 1 on a back side thereof.

FIG. 1 shows xyz coordinate axes, the y-axis being an axis parallel to a crystal growth direction of the semiconductor laser device LD1, the x-axis being an axis parallel to a surface direction of each semiconductor layer and the z-axis being an axis parallel to a laser light emitting direction. An end face of a resonator of the semiconductor laser device LD1 is provided on the front side and on the back side of the surface of the sheet in FIG. 1 and the z-axis also corresponds to the resonator length direction. In the following drawings, xyz coordinate axes are described in cross-sectional views of the semiconductor laser device, and the relationship between the respective coordinate axes and the semiconductor laser device is assumed to be the same as that described above.

On the n-type GaAs substrate 2, an n-type AlGaAs clad layer 3, an n-side AlGaAs light guide layer 4, an n-side AlGaAs barrier layer 5, an InGaAs quantum well active layer 6, an AlGaAs barrier layer 7, an InGaAs quantum well active layer 8, a p-side AlGaAs barrier layer 9, a p-side AlGaAs light guide layer 10, a p-type AlGaAs clad layer 11, a p-type GaAs contact layer 12, an SiN film 13, and a p-type electrode 14 are laminated in that order.

An n-type AlGaAs low refractive index layer 15 is provided between the n-type AlGaAs clad layer 3 and the n-side AlGaAs light guide layer 4.

The n-type AlGaAs clad layer 3 has an Al composition ratio of 0.250 and a layer thickness of 1.5 μm. The n-side AlGaAs light guide layer 4 has an Al composition ratio of 0.200 and a layer thickness of tgn. The n-side AlGaAs barrier layer 5 has an Al composition ratio of 0.100 and a layer thickness of 10 nm. The InGaAs quantum well active layer 6 has an In composition ratio of 0.063 and a layer thickness of 8 nm.

The AlGaAs barrier layer 7 has an Al composition ratio of 0.100 and a layer thickness of 3 nm. The InGaAs quantum well active layer 8 has an In composition ratio of 0.063 and a layer thickness of 8 nm. The p-side AlGaAs barrier layer 9 has an Al composition ratio of 0.100 and a layer thickness of 10 nm. The p-side AlGaAs light guide layer 10 has an Al composition ratio of 0.200 and a layer thickness of tgp.

The p-type AlGaAs clad layer 11 has an Al composition ratio of 0.250 and a layer thickness of 1.5 μm. The p-type GaAs contact layer 12 has a layer thickness of 0.2 μm. The SiN film 13 has a layer thickness of 0.2 μm. The n-type AlGaAs low refractive index layer 15 has an Al composition ratio of 0.350 and a layer thickness of t1 (parameter).

The oscillation wavelength of laser light emitted from the InGaAs quantum well active layer 8 is 915 nm.

In the structure which will be described here, suppose tgn=tgp=700 nm. Furthermore, according to the item described as an example in "Semiconductor Laser," written and edited by Kenichi Iga, pp. 35-38, when the Al composition ratio of the AlGaAs layer with a wavelength of 915 nm is 0.100, 0.200, 0.250 and 0.350, the refractive index thereof is 3.494123, 3.426089, 3.393771 and 3.331509 respectively. Moreover, the refractive index of the In composition ratio of 0.063 is 3.528561.

Furthermore, there is a description of a v value which is a normalized frequency on page 21 of "Light Guide" written by Shoji Kawakami, pp. 18-25, Sep. 20, 1980, Asakura Publishing Co., Ltd. The v value which is a normalized frequency is a parameter representing the allowable number of modes.

When this v value is less than $\pi/2$, only a fundamental mode (0th-order) is allowed. When the v value falls within a range of $\pi/2$ or more and less than $\pi$, two modes of a 0th-order mode and a first-order mode are allowed. When the v value falls within a range of $\pi$ or more and less than $3\pi/2$, three modes of a 0th-order mode, first-order mode and second-order mode are allowed. When the v value increases, the number of allowed modes increases.

The refractive indices of the n-side AlGaAs barrier layer 5, the InGaAs quantum well active layer 6, the AlGaAs barrier layer 7, the InGaAs quantum well active layer 8 and the p-side AlGaAs barrier layer 9 are greater than those of the light guide layers that sandwich those layers. Thus, when the v value is calculated by substituting the refractive index of the light guide layer for the refractive indices of these layers, the v value is 2.320, which is greater than $\pi/2$.

As described above, this means that two modes of a fundamental mode (0th-order) and a first-order mode are allowed in the crystal growth (y) direction. In the refractive index distribution of the present structure which will be described using FIG. 1, the thickness of the total light guide layer structure for which the first-order or higher-order mode is allowed is 974 nm or more.

Figure 2A:
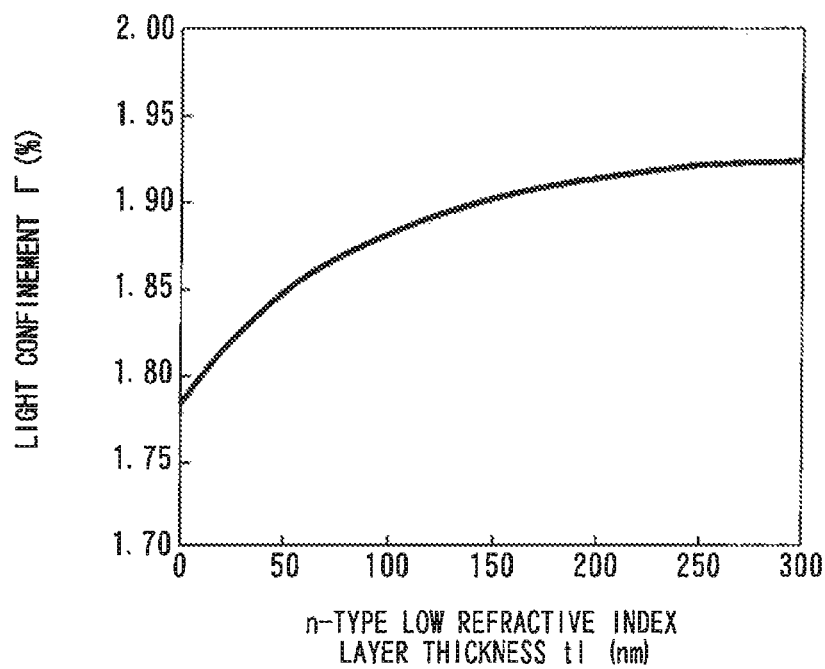
FIGS. 2A and 2B are diagrams illustrating characteristics of the semiconductor laser device LD1 provided with a structure which constitutes a premise of the first embodiment of the present invention.

FIG. 2 is a diagram illustrating characteristics of the semiconductor laser device LD1 provided with a structure which constitutes a premise of the first embodiment of the present invention. FIG. 2A is a diagram illustrating a layer thickness t1 dependency of the n-type AlGaAs low refractive index layer 15 having light confinement Γ relating to the fundamental mode of the InGaAs quantum well active layer 8.

According to FIG. 2A, it is clear that light confinement monotonously increases as the layer thickness of the low refractive index layer increases. This is also apparent from a comparison between FIG. 2 and FIG. 13, which shows a reverse tendency of the semiconductor laser device LD0 according to the prior art described using FIG. 12 and reflects that provision of the n-type low refractive index layer narrows a light intensity distribution of NFP.

Figure 2B:
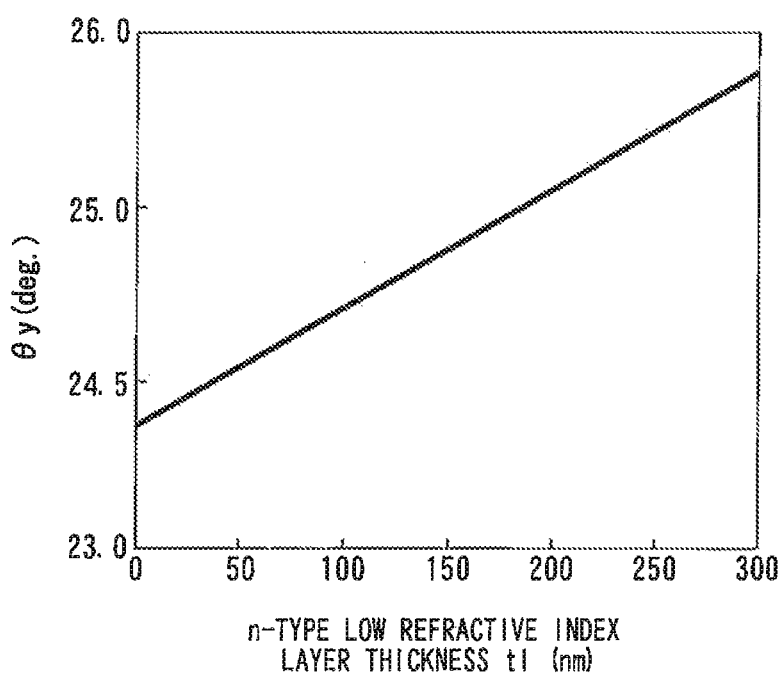

On the other hand, FIG. 2B is a diagram illustrating a layer thickness dependency of the n-type low refractive index layer of a full width at half maximum (θy) of a crystal growth direction FFP. It is clear that θy monotonously increases as the layer thickness of the low refractive index layer increases and FFP expands. This also indicates that the light intensity distribution of NFP narrows. In this respect, as is clear from the comparison between FIG. 2 and FIG. 13, the reverse tendency of the semiconductor laser device LD0 according to the prior art described in FIG. 12 appears.

That is, a semiconductor laser device for which a first-order or higher-order mode is allowed in the crystal growth direction, providing the n-type low refractive index layer makes it possible to increase light confinement and consequently reduce a threshold current.

Whether or not a semiconductor laser device has a light guide layer having a total light guide layer structure thickness of 1000 nm or more constitutes a guideline for a "semiconductor laser device for which a first-order or higher-order mode is allowed in the crystal growth direction." The "total light guide layer structure thickness" is the sum of the layer thickness of the n-side light guide layer, the layer thickness of the active layer, and the layer thickness of the p-side light guide layer.

Note that in the semiconductor laser device LD0 shown in FIG. 12, if the refractive indices of the p-side AlGaAs barrier layer 109, the InGaAs quantum well active layer 108, the AlGaAs barrier layer 107, the InGaAs quantum well active layer 106, and the n-side AlGaAs barrier layer are approximated to be the same as that of the light guide layer having an Al composition ratio of 0.183, the layer thickness of the high refractive index layer becomes 139 nm. In this case, since the v value is 0.4697 which is smaller than $\pi/2$, it is obvious that only the fundamental mode is allowed.

Moreover, the present inventor has confirmed that only the fundamental mode is allowed in an exact numerical analysis taking into account the refractive indices of the p-side AlGaAs barrier layer 109, the InGaAs quantum well active layer 108, the AlGaAs barrier layer 107, the InGaAs quantum well active layer 106, and the n-side AlGaAs barrier layer.

Figure 3:
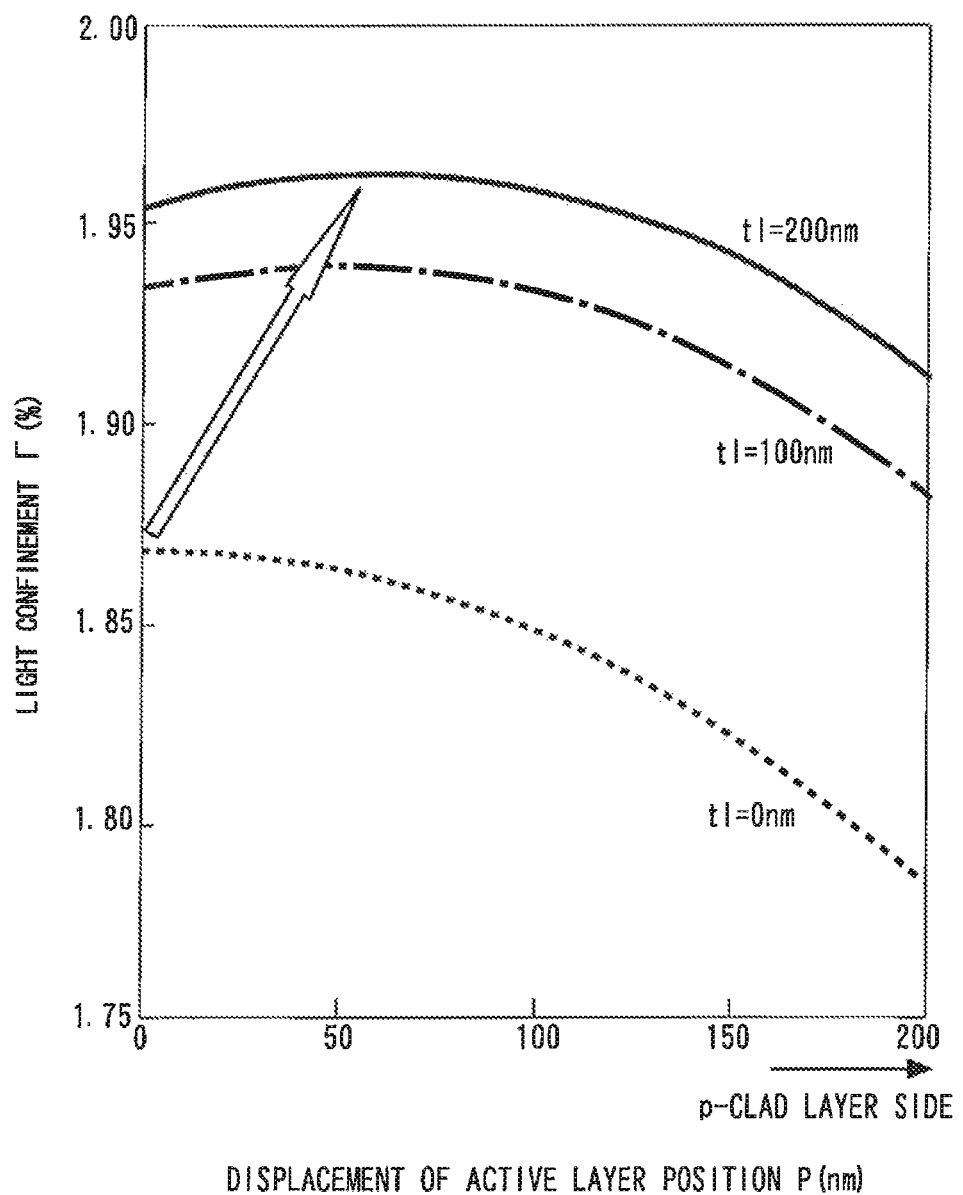
FIG. 3 is a diagram illustrating characteristics of the semiconductor laser device LD1 provided with a structure which becomes the premise of the first embodiment of the present invention.

FIG. 3 is a diagram illustrating characteristics of the semiconductor laser device LD1 provided with a structure which becomes the premise of the first embodiment of the present invention. In a case where the sum tgn+tgp=1400 nm, where tgn is the layer thickness of the n-side AlGaAs light guide layer 4 and tgp is the layer thickness of the p-side AlGaAs light guide layer 10, FIG. 3 shows the active layer position P dependency of the light confinement F in the fundamental mode using the layer thickness t1 of the n-type low refractive index layer as a parameter.

A broken line shows a characteristic curve when t1=0 nm, that is, when no n-type low refractive index layer is provided. It is apparent how the light confinement becomes highest at the center position (P=0 nm) of the total light guide layer structure and the light confinement decreases when the active layer position is displaced toward the p-type clad layer.

A single-dot dashed line shows a case where an n-type low refractive index layer having a layer thickness of 100 nm is provided. It is apparent that the peak intensity of light confinement increases compared to the case where no n-type low refractive index layer is provided and the peak intensity position is displaced toward the p-type clad layer side.

A solid line shows a case where an n-type low refractive index layer having a layer thickness of 200 nm is provided. It is also apparent that the peak intensity of light confinement further increases and the peak intensity position is displaced toward the p-type clad layer side (see an arrow in the figure).

For example, the peak position of the light intensity distribution and light confinement at the position when no n-type low refractive index layer is provided are 0 μm and 1.868% respectively. In contrast, when an n-type low refractive index layer having a layer thickness of 200 nm is provided, the peak position of the light intensity distribution and light confinement at the position are 60 μm and 1.963% respectively.

When the active layer position is displaced, the light confinement in the first-order or higher-order mode increases, but such light confinement is normally small compared to the light confinement in the fundamental mode, and thereby poses no problem. When the light confinement in the fundamental mode falls within a range in which it is greater than light confinement in the first-order or higher-order mode, the higher-order mode never oscillates, and it is therefore only necessary to consider light confinement in the fundamental mode.

Configuration of Device According to First Embodiment

Figure 4:
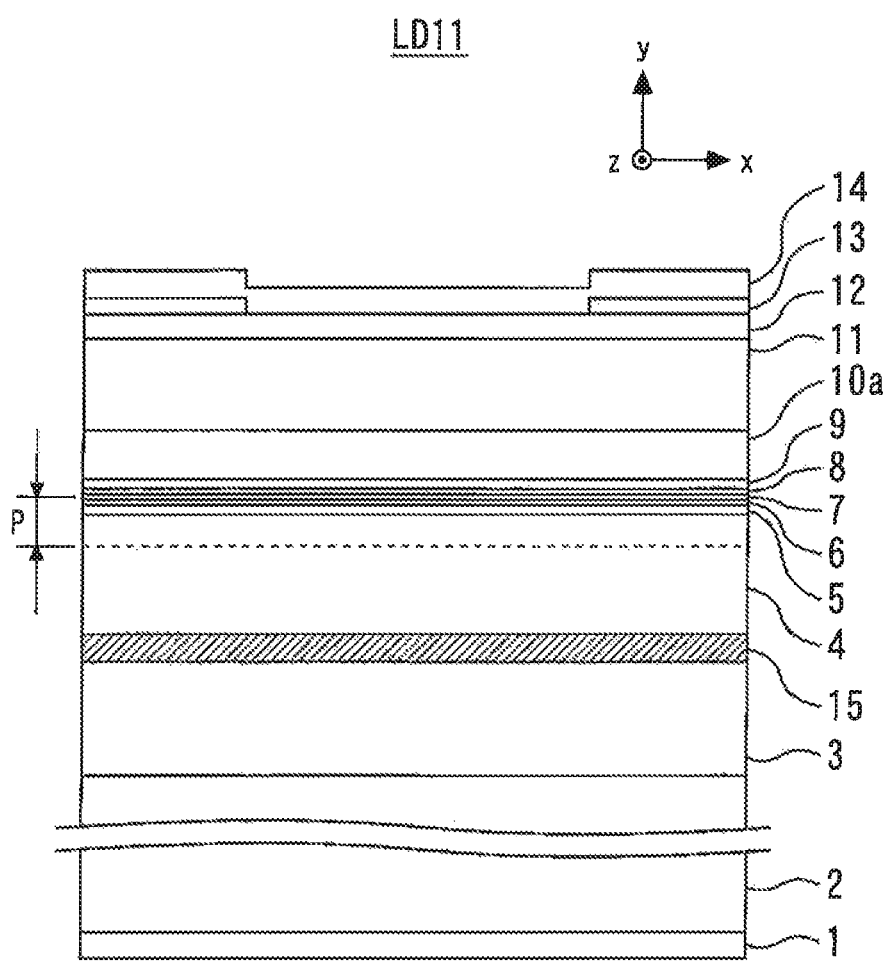
FIG. 4 is a cross-sectional view illustrating a semiconductor laser device LD11 according to the first embodiment of the present invention.

FIG. 4 is a cross-sectional view illustrating a semiconductor laser device LD11 according to the first embodiment of the present invention. The semiconductor laser device LD11 shown in FIG. 4 is provided with a p-side AlGaAs light guide layer 10a. The rest of the layer structure is the same as that in FIG. 1.

The p-side AlGaAs light guide layer 10a has an Al composition ratio of 0.183 and a layer thickness of tgp. The refractive index of the p-side AlGaAs light guide layer 10a having an Al composition ratio of 0.183 is 3.437535, which is higher than the refractive index of the n-side AlGaAs light guide layer 4. In FIG. 4, the sum tgn+tgp is also assumed to be 1400 nm, where tgn is the layer thickness of the n-side AlGaAs light guide layer 4 and tgp is the layer thickness of the p-side AlGaAs light guide layer 10a.

Figure 5:
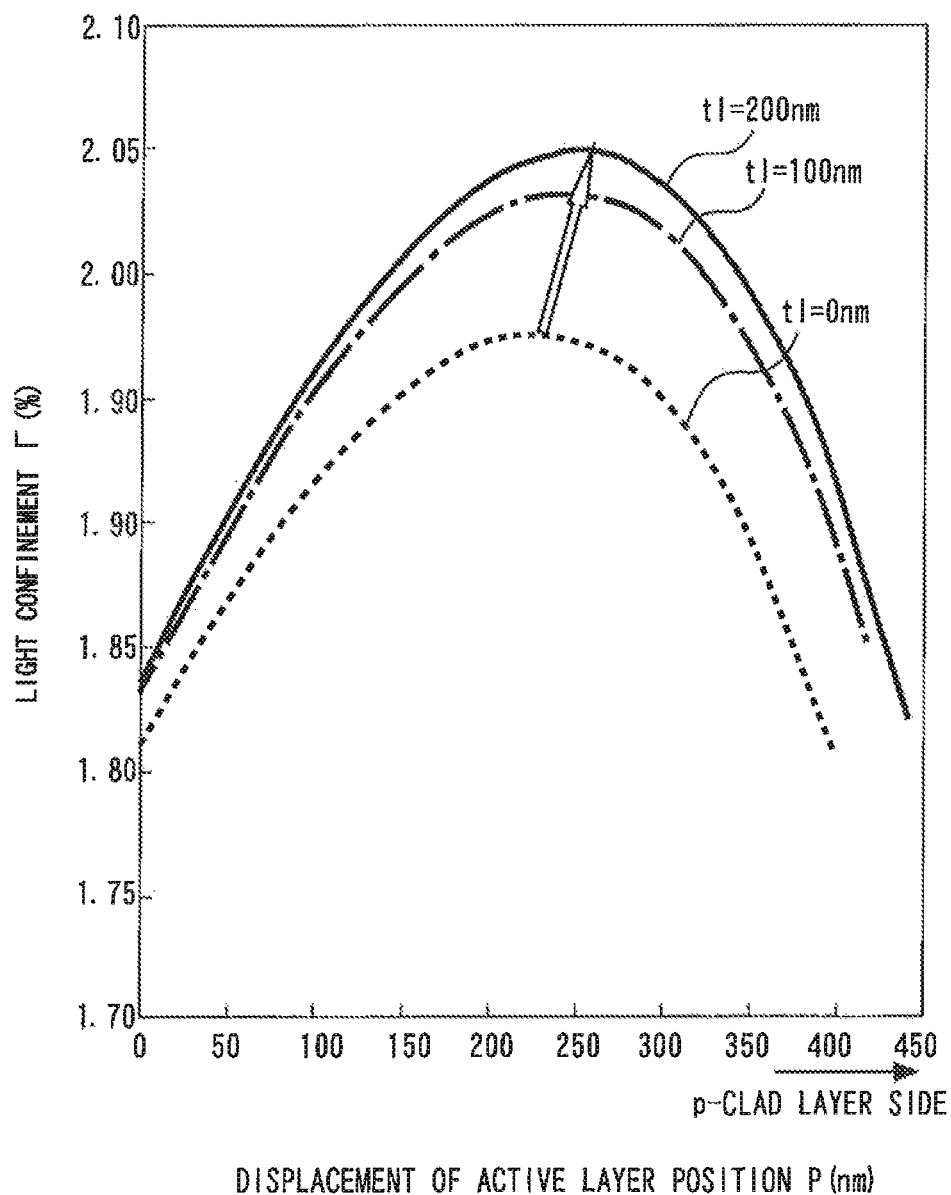
FIG. 5 is a diagram illustrating an active layer position dependency of light confinement in the fundamental mode in the structure in FIG. 4.

FIG. 5 is a diagram illustrating an active layer position dependency of light confinement in the fundamental mode in the structure in FIG. 4 using the layer thickness t1 of the n-type low refractive index layer as a parameter. In FIG. 5, a broken line shows a case where no n-type low refractive index layer is provided (t1=0), a single-dot dashed line shows a case where an n-type low refractive index layer having a layer thickness t1=100 nm is provided and a solid line shows a case where an n-type low refractive index layer having a layer thickness t1=200 nm is provided.

As is apparent from a comparison of FIG. 3 and FIG. 5, if the refractive index of the p-side light guide layer is made higher than that of the n-side light guide layer, it is apparent that the position at which light confinement reaches a peak is displaced toward the p-type clad layer side. It is also apparent that the light confinement itself increases.

It is also apparent that when the n-type low refractive index layer is inserted, the position at which light confinement reaches a peak is displaced toward the p-type clad layer side and the light confinement itself increases (see an arrow in FIG. 5). When the n-type low refractive index layer having a layer thickness of 200 nm is inserted, the peak position of light confinement and light confinement are 240 nm and 2.048% respectively.

As described above, if a semiconductor laser device that allows a first-order or higher-order mode in the crystal growth direction satisfies all the following conditions (a1) to (a3), it is possible to reduce a threshold current through an improvement of light confinement and improve slope efficiency through displacement of the active layer position toward the p-type clad layer side.

(a1) A low refractive index layer having a lower refractive index than that of the n-clad layer is provided between the n-side light guide layer and the n-type clad layer.

(a2) The refractive index of the p-side light guide layer is made higher than that of the n-side light guide layer.

(a3) The active layer position P is displaced closer to the p-type clad layer side than the center of the total light guide layer structure, that is a layer thickness of the n-side light guide layer is greater than a layer thickness of the p-side light guide layer.

As a result, a semiconductor laser device having high power conversion efficiency is provided.

Modification Example of Apparatus of First Embodiment

Figure 6:
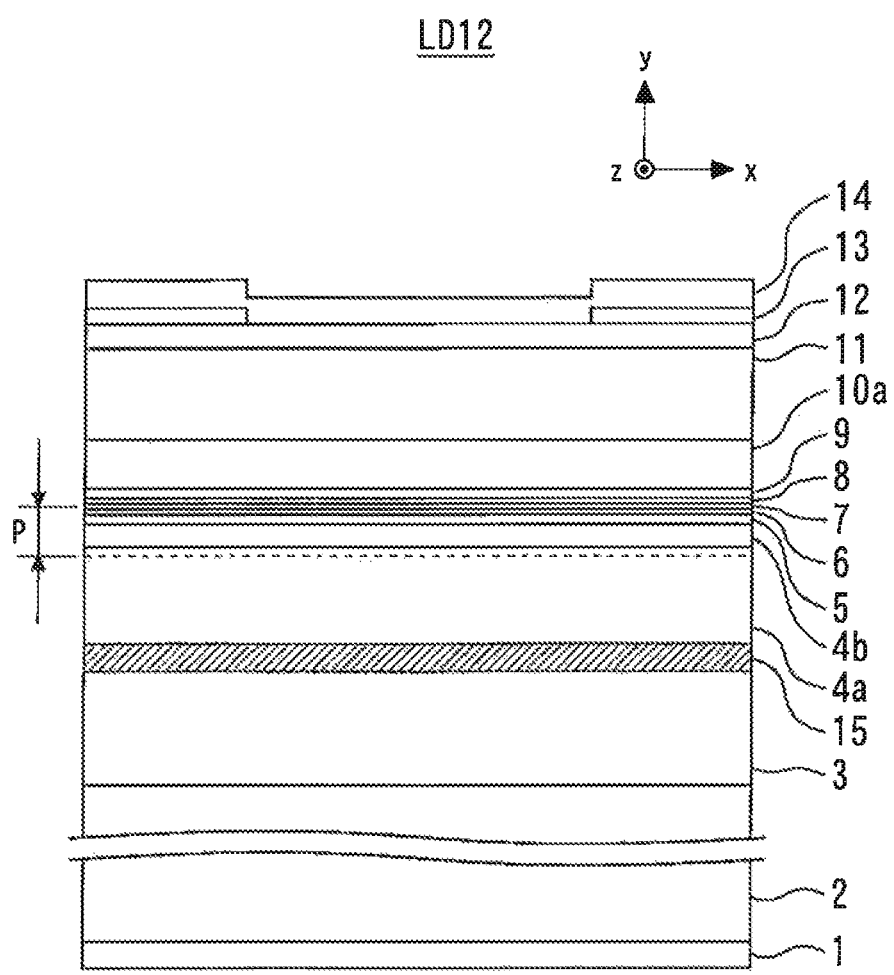
FIG. 6 is a cross-sectional view illustrating a semiconductor laser device LD12 according to a modification example of the first embodiment of the present invention.

FIG. 6 is a cross-sectional view illustrating a semiconductor laser device LD12 according to a modification example of the first embodiment of the present invention. The semiconductor laser device LD12 is provided with a two-layer structure of a first n-side AlGaAs light guide layer 4a and a second n-side AlGaAs light guide layer 4b.

The first n-side AlGaAs light guide layer 4a has an Al composition ratio of 0.200 and a layer thickness of tgn1. The second n-side AlGaAs light guide layer 4b has an Al composition ratio of 0.183 and a layer thickness of tgn2. The rest of the structure is the same as that of the semiconductor laser device LD1 in FIG. 4, assigned the same reference numerals and description thereof will be omitted.

Suppose the layer thickness of the first n-side AlGaAs light guide layer 4a is tgn1, the layer thickness of the second n-side AlGaAs light guide layer 4b is tgn2, and the layer thickness of the p-side AlGaAs light guide layer 10a is tgp. The sum of these layer thicknesses is assumed to be 1400 nm in the present embodiment.

Figure 7:
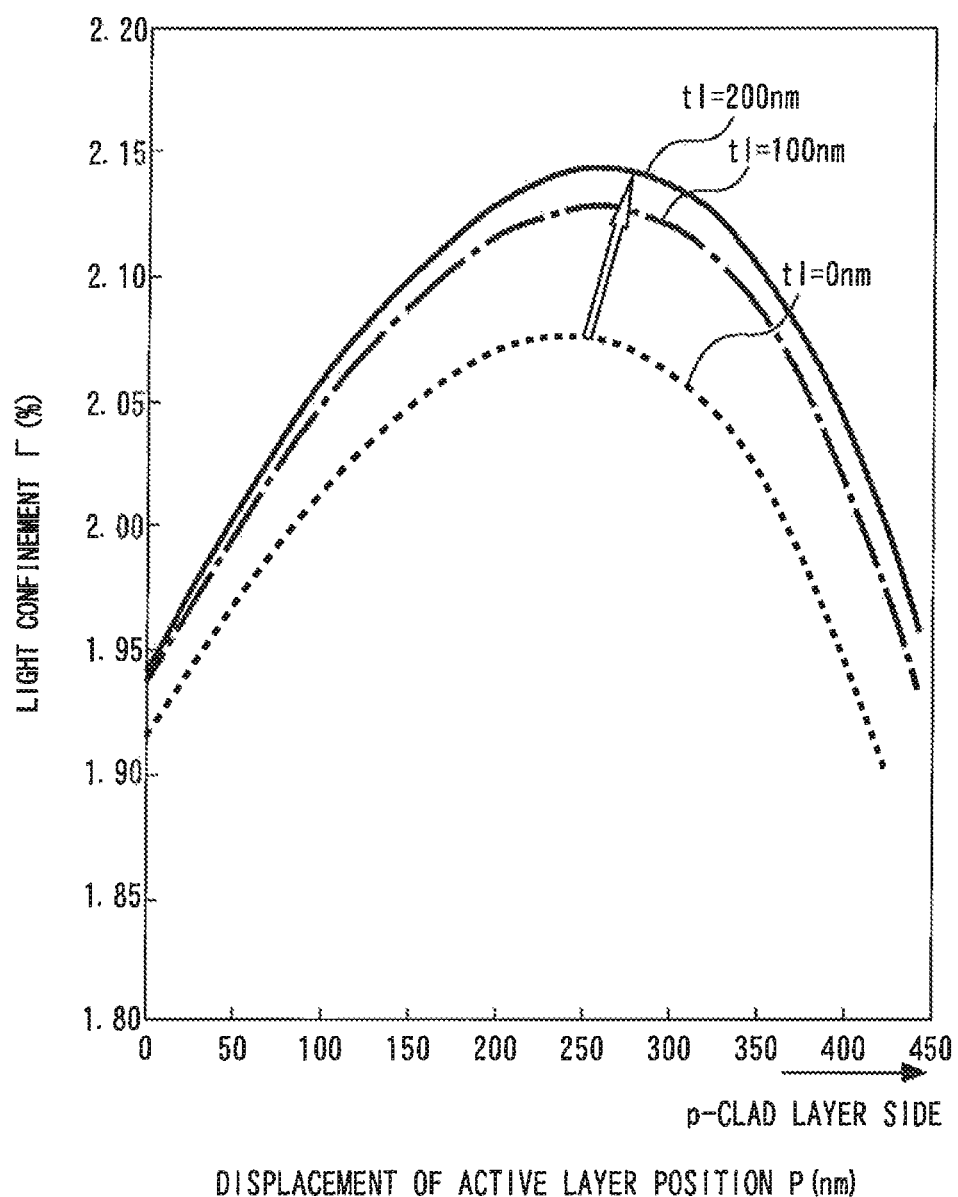
FIG. 7 is a diagram illustrating characteristics of the semiconductor laser device LD12 according to the modification example of the first embodiment of the present invention.

FIG. 7 is a diagram illustrating characteristics of the semiconductor laser device LD12 according to the modification example of the first embodiment of the present invention. FIG. 7 shows an active layer position dependency of light confinement in the fundamental mode in the structure in FIG. 6 when the layer thickness tgn2 of the n-side AlGaAs light guide layer 4b is fixed to 100 nm using the layer thickness t1 of the n-type low refractive index layer as a parameter.

In FIG. 7, a broken line is a characteristic curve in a case where no n-type low refractive index layer is provided (t1=0). A single-dot dashed line is a characteristic curve in a case where an n-type low refractive index layer having a layer thickness t1=100 nm is provided. A solid line is a characteristic curve in a case where an n-type low refractive index layer having a layer thickness t1=200 nm is provided.

As is clear from a comparison of FIG. 5 and FIG. 7, if the n-side guide layer is assumed to have two layers, the peak intensity of light confinement increases (arrow in the figure). For this reason, the threshold current of the semiconductor laser can be reduced. Moreover, since the peak position of light confinement can also be displaced toward the p-type clad layer side, the slope efficiency can be improved. Note that the peak position of light confinement and light confinement when the n-type low refractive index layer having a layer thickness of 200 nm is inserted are 260 nm and 2.144% respectively.

In the semiconductor laser device LD12 in FIG. 6, it is assumed that the n-side light guide layer has two layers and the p-side light guide layer has one layer, but a structure having two or more layers can also be adopted. For example, when the n-side light guide layer and the p-side light guide layer have two layers, the following may be considered.

The semiconductor laser device can be designed so as to satisfy the following expression (1) in a case where a refractive index of the first n-side light guide layer is ngn1, a refractive index of the second n-side light guide layer is ngn2, a refractive index of the first p-side light guide layer is ngp1 and a refractive index of the second p-side light guide layer is npg2.

$$(ngp1+ngp2)/2 > (ngn1+ngn2)/2 \quad (1)$$

Similarly, consider a case with a multilayer structure having three or more layers, for example, n layers (n is an integer equal to or greater than 3). First, suppose the refractive index of the first n-side light guide layer is ngn1, the refractive index of the second n-side light guide layer is ngn2, ... the refractive index of the n-th n-side light guide layer is ngnn. Furthermore, suppose the refractive index of the first p-side light guide layer is ngp1, the refractive index of the second p-side light guide layer is npg2, ... the refractive index of the n-th p-side light guide layer is npgn. In this case, the semiconductor laser device can be designed so as to satisfy the following expression (2).

$$(ngp1+ngp2+ \ldots +ngpn)/n > (ngn1+ngn2+ \ldots +ngnn)/n \quad (2)$$

Second Embodiment

Figure 8:
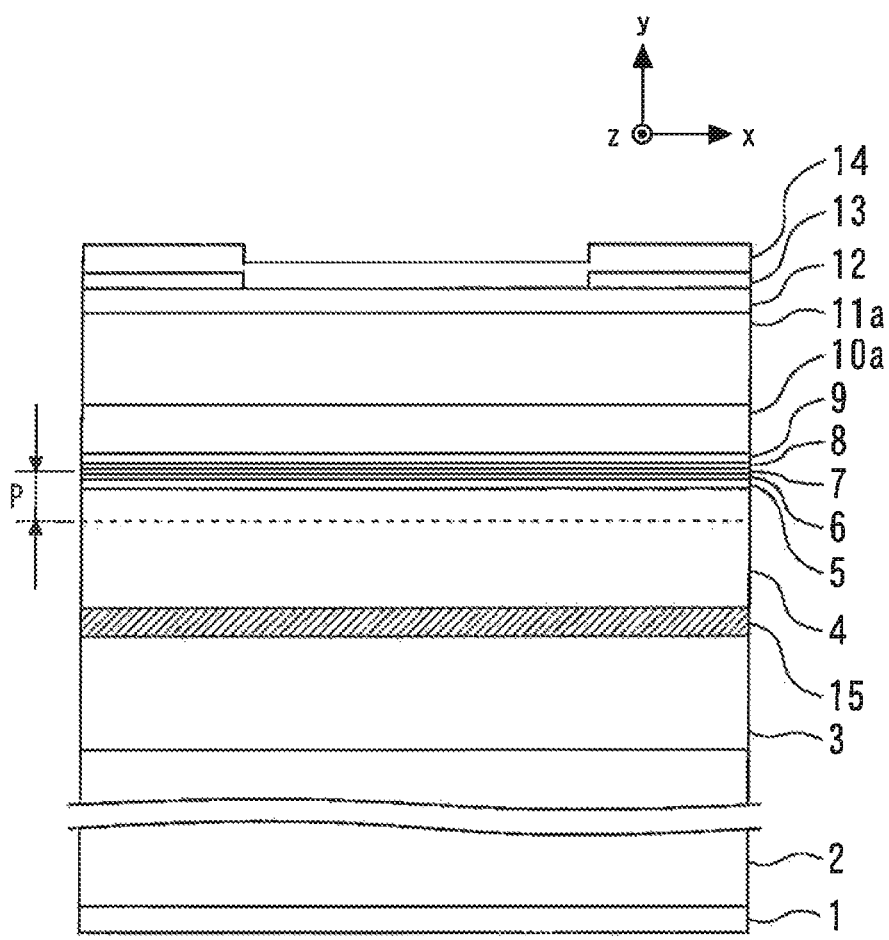
FIG. 8 is a cross-sectional view illustrating a semiconductor laser device LD2 according to a second embodiment of the present invention.

FIG. 8 is a cross-sectional view illustrating a semiconductor laser device LD2 according to a second embodiment of the present invention. The present embodiment adopts a lower refractive index for a p-type clad layer than that for an n-type clad layer.

As shown in FIG. 8, the semiconductor laser device LD2 has a p-type AlGaAs clad layer 11a having an Al composition ratio of 0.300 and a layer thickness of 1.5 µm. The refractive index having the Al composition ratio of 0.300 is 3.362355 which is lower than the refractive index 3.393771 of the n-type clad layer. The rest are the same as that in FIG. 4 and the sum tgn+tgp is assumed to be 1400 nm where tgn is the layer thickness of the n-side AlGaAs light guide layer 4 and tgp is the layer thickness of the p-side AlGaAs light guide layer 10a.

Figure 9:
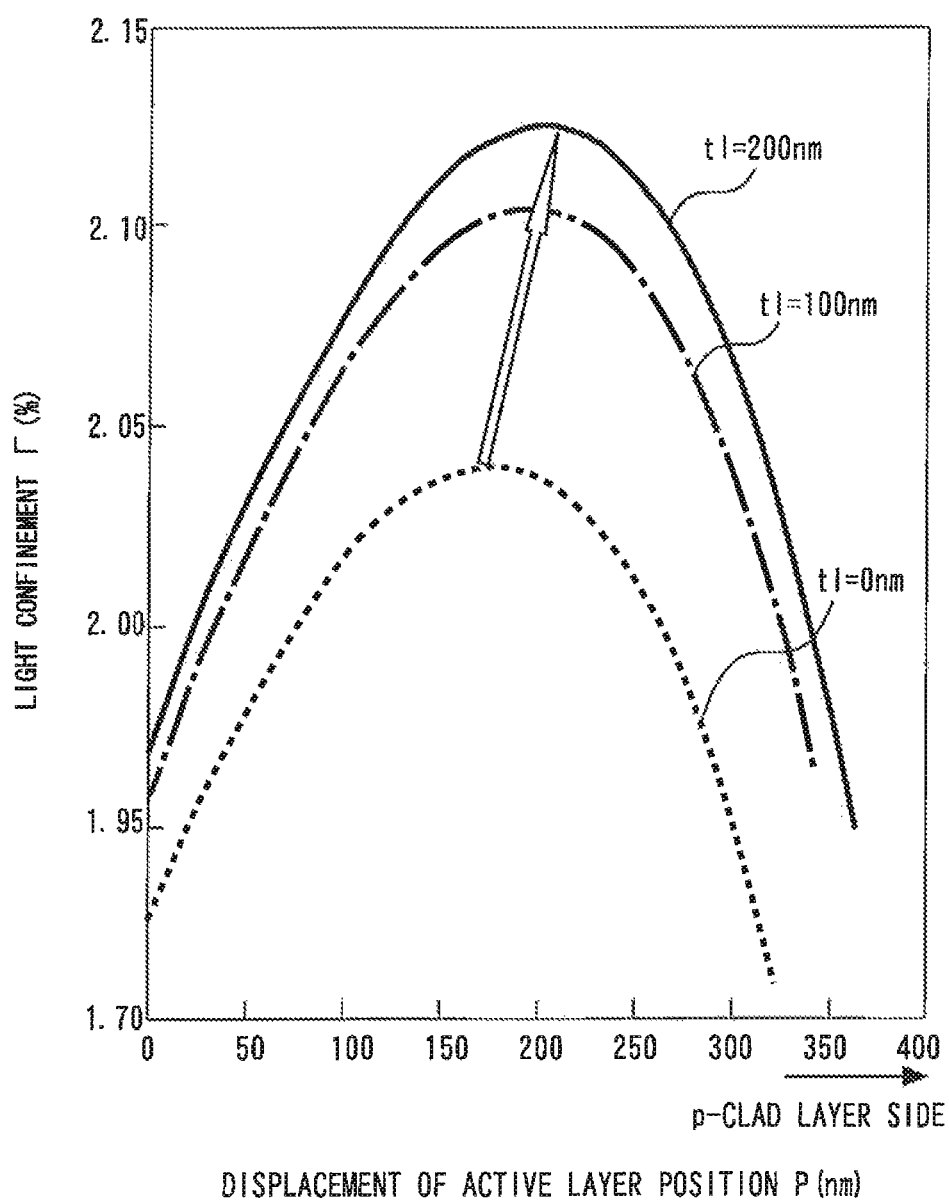
FIG. 9 is a diagram illustrating an active layer position dependency of light confinement in a fundamental mode in the structure in FIG. 8.

FIG. 9 is a diagram illustrating an active layer position dependency of light confinement in a fundamental mode in the structure in FIG. 8 using a layer thickness t1 of the n-type low refractive index layer as a parameter. In FIG. 9, a broken line shows a case where no n-type low refractive index layer is provided (t1=0), a single-dot dashed line shows a case where an n-type low refractive index layer having a layer thickness t1=100 nm is provided and a solid line shows a case where an n-type low refractive index layer having a layer thickness t1=200 nm is provided.

As is apparent from a comparison of FIG. 5 and FIG. 9, if the refractive index of the p-type clad layer is made lower than that of the n-type clad layer, the peak intensity of light confinement increases (an arrow in the figure). For this reason, it is possible to reduce the threshold current of the semiconductor laser.

The peak position of light confinement cannot be displaced toward the p-type clad layer side more than a case where the p-type clad layer and the n-type clad layer have the same refractive index. However, the peak position of light confinement can be displaced toward the p-type clad layer side more than a case as shown in FIG. 1 where the p-type clad layer and the n-type clad layer have the same refractive index and where the p-side light guide layer and the n-side light guide layer have the same refractive index. For this reason, the slope efficiency can be improved more than that in the structure in FIG. 1.

Note that when an n-type low refractive index layer having a layer thickness of 200 nm is inserted, the peak position of light confinement and light confinement are 200 nm and 2.125% respectively.

As described above, if a semiconductor laser device that allows a first-order or higher-order mode in the crystal growth direction satisfies all the following conditions (b1) to (b4), it is possible to reduce a threshold current through an improvement of light confinement and improve slope efficiency through displacement of the active layer position toward the p-type clad layer side.

(b1) A low refractive index layer having a lower refractive index than that of the n-clad layer is provided between the n-side light guide layer and the n-type clad layer.

(b2) The refractive index of the p-side light guide layer is made higher than that of the n-side light guide layer.

(b3) The refractive index of the p-type clad layer is made lower than that of the n-type clad layer.

(b4) The active layer position P is displaced closer to the p-type clad layer side than the center of the total light guide layer structure, that is a layer thickness of the n-side light guide layer is greater than a layer thickness of the p-side light guide layer.

As a result, a semiconductor laser device having high power conversion efficiency can be realized.

Furthermore, the light guide layer may have a multilayer structure as shown in the modification example of the first embodiment.

Third Embodiment

Figure 10:
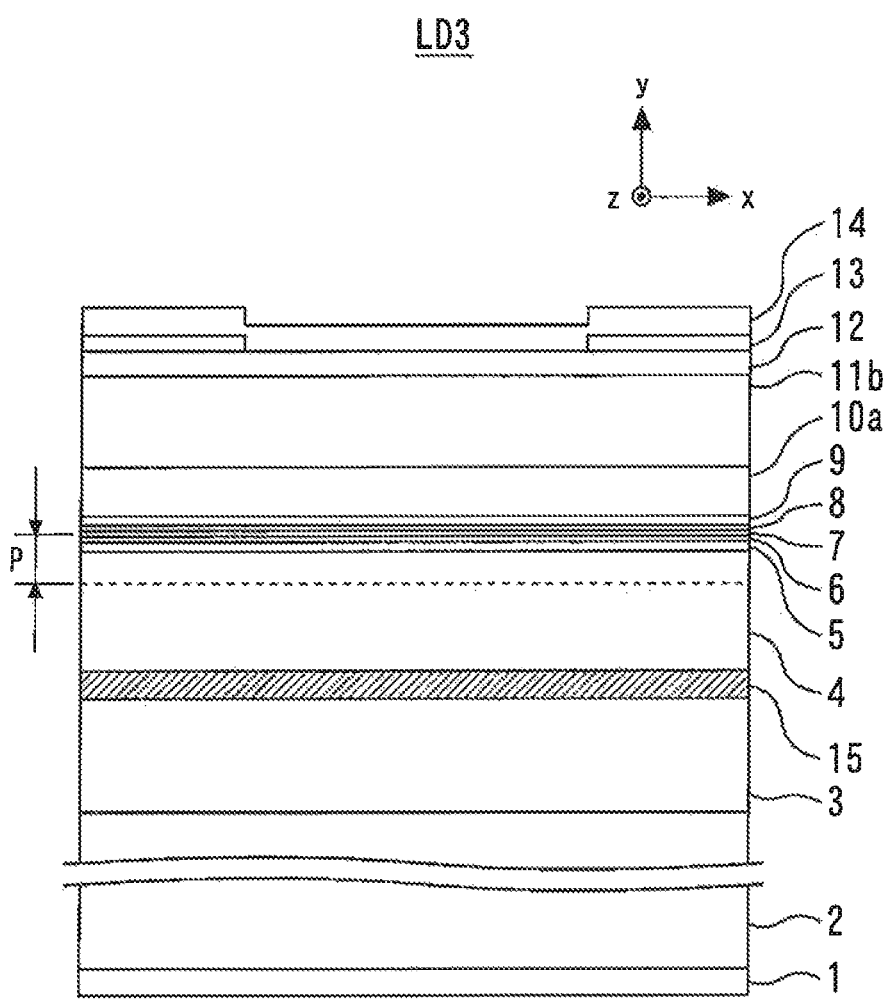
FIG. 10 is a cross-sectional view illustrating a semiconductor laser device LD3 according to a third embodiment of the present invention.

FIG. 10 is a cross-sectional view illustrating a semiconductor laser device LD3 according to a third embodiment of the present invention. The present embodiment adopts a higher refractive index for the p-type clad layer than that of the n-type clad layer.

The semiconductor laser device LD3 shown in FIG. 10 corresponds to the semiconductor laser device LD11 according to the first embodiment with the p-type AlGaAs clad layer 11 replaced by a p-type AlGaAs clad layer 11b. The p-type AlGaAs clad layer 11b has an Al composition ratio of 0.230 and a layer thickness of 1.5 µm. At this time, the refractive index at the Al composition ratio of 0.230 is 3.406633 higher than 3.393771 which is the refractive index value of the n-type clad layer.

Structures of the other respective layers in the semiconductor laser device LD3 are the same as those of the semiconductor laser device LD11 shown in FIG. 4. The sum tgn+tgp is assumed to be 1400 nm where tgn is the layer thickness of the n-side AlGaAs light guide layer 4 and tgp is the layer thickness of the p-side AlGaAs light guide layer 10a.

Figure 11:
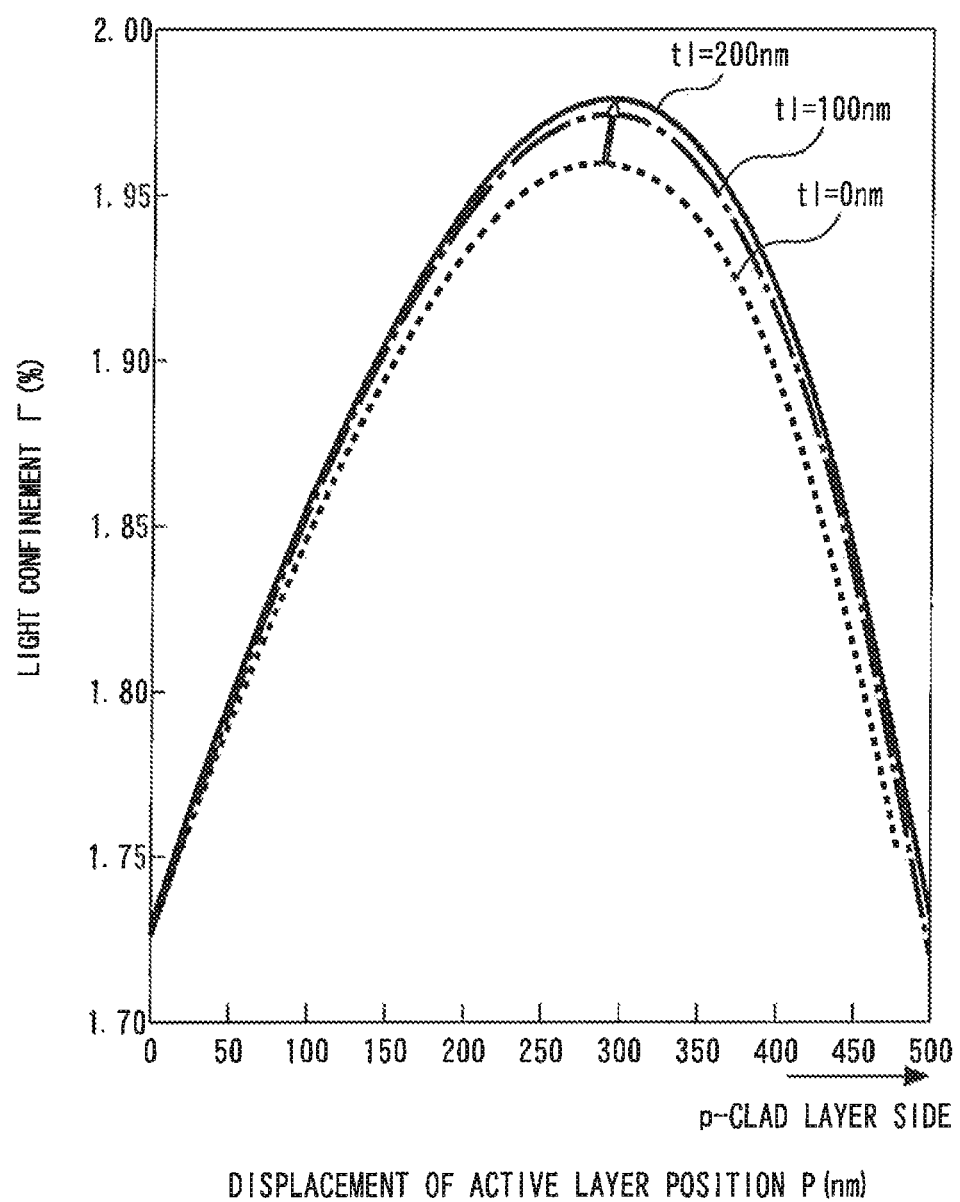
FIG. 11 is a diagram illustrating an active layer position dependency of light confinement in a fundamental mode in the structure in FIG. 10.

FIG. 11 is a diagram illustrating an active layer position dependency of light confinement in a fundamental mode in the structure in FIG. 10 using a layer thickness t1 of the n-type low refractive index layer as a parameter. In FIG. 10, a broken line shows a case where no n-type low refractive index layer is provided (t1=0), a single-dot dashed line shows a case where an n-type low refractive index layer having a layer thickness t1=100 nm is provided and a solid line shows a case where an n-type low refractive index layer having a layer thickness t1=200 nm is provided.

As is apparent from a comparison of FIG. 5 and FIG. 11, if the refractive index of the p-type clad layer is made higher than that of the n-type clad layer, the peak position of light confinement can be displaced toward the p-type clad layer side. For this reason, it is possible to reduce the number of carriers residing in the light guide layer and increase slope efficiency of the semiconductor laser.

Furthermore, the peak intensity of light confinement in the third embodiment is smaller than that in a case where the p-type clad layer and the n-type clad layer have the same refractive index. However, compared to the case with the semiconductor laser device LD1 in FIG. 1 where the p-type clad layer and the n-type clad layer have the same refractive index, and the p-side light guide layer and the n-side light guide layer have the same refractive index, the third embodiment makes it possible to increase the peak intensity of light confinement.

Thus, according to the semiconductor laser device LD3 according to the third embodiment, the threshold current can be reduced compared to the semiconductor laser device LD1. Note that when an n-type low refractive index layer having a layer thickness of 200 nm is inserted, the peak position of light confinement and light confinement are 300 nm and 1.979% respectively.

As described above, if a semiconductor laser device that allows a first-order or higher-order mode in the crystal growth direction satisfies all the following conditions (c1) to (c4), it is possible to reduce a threshold current through an improvement of light confinement and improve slope efficiency through displacement of the active layer position toward the p-type clad layer side.

(c1) A low refractive index layer having a lower refractive index than that of the n-clad layer is provided between the n-side light guide layer and the n-type clad layer.

(c2) The refractive index of the p-side light guide layer is made higher than that of the n-side light guide layer.

(c3) The refractive index of the p-type clad layer is made higher than that of the n-type clad layer.

(c4) The active layer position P is displaced closer to the p-type clad layer side than the center of the total light guide layer structure, that is a layer thickness of the n-side light guide layer is greater than a layer thickness of the p-side light guide layer.

As a result, a semiconductor laser device having high power conversion efficiency can be realized.

Furthermore, the light guide layer may have a multilayer structure as shown in the modification example of the first embodiment.

In the present embodiment, it is AlGaAs that is the semiconductor material that makes up the barrier layer, the light guide layer and the clad layer. However, the present invention is not limited to this. The material only needs to satisfy the relationship among the refractive indices of these layers described in the respective embodiments, and other materials such as GaN-based, AlGaInP-based, InP-based materials may also be used. The aforementioned embodiments have described InGaAs as the active layer having an oscillation wavelength of 915 nm by way of example, but it goes without saying that another oscillation wavelength may also be adopted using another active layer material.

Note that although the total layer thickness of the light guide layer is assumed to be 1400 nm, the total layer thickness is not limited to this, and any semiconductor laser may be employed for which a first-order or higher-order mode is allowed in the crystal growth direction. The condition under which a first-order or higher-order mode is shared in the crystal growth direction is as mentioned in the description of the normalized frequency v value in the first embodiment and the v value only needs to take a value equal to or greater than $\pi/2$.

In the semiconductor laser device according to the embodiments of the present invention, technical features TF1 to TF5 relating to a layer thickness and a refractive index, and operations and effects derived from these features may be summarized as follows.

(Technical Feature TF1)

A low refractive index layer having a lower refractive index than that of the n-type clad layer is provided between the n-type clad layer and the n-side light guide layer. It is thereby possible to displace the peak position of the light intensity distribution of NFP from the center of the light guide layer toward the p-type clad layer side. Furthermore, the peak intensity of the light intensity distribution of NFP can be increased compared to a case without this low refractive index layer. An effect of increasing light confinement in the active layer and reducing a threshold current can be obtained in this way.

(Technical Feature TF2)

The n-side light guide layer thickness is made greater than the p-side light guide layer thickness. It is thereby possible to displace the active layer position from the center of the light guide layer toward the p-type clad layer side. Furthermore, by reducing the number of carriers residing in the light guide layer, carrier absorption can be reduced. As a result, an effect of increasing slope efficiency can be obtained.

(Technical Feature TF3)

The refractive index of the p-side light guide layer is made higher than the refractive index of the n-side light guide layer. This allows the peak position of light intensity distribution of NFP to be displaced from the center of the light guide layer toward the p-type clad layer side. Furthermore, the peak intensity of light intensity distribution of NFP can be made greater than that in a case where the p-side light guide layer and the n-side light guide layer have the same refractive index. This has an effect of increasing light confinement in the active layer and reducing a threshold current.

(Technical Feature TF4)

The refractive index of the p-type clad layer is made lower than that of the n-type clad layer. This allows the peak intensity of light intensity distribution of NFP to increase compared to a case where the p-type clad layer and the n-type clad layer have the same refractive index. This has an effect of increasing light confinement in the active layer and reducing the threshold current.

(Technical Feature TF5)

The refractive index of the p-type clad layer is made higher than that of the n-type clad layer. This allows the peak position of light intensity distribution of NFP to be displaced from the center of the total light guide layer structure toward the p-type clad layer side compared to a case where the refractive index of the p-type clad layer is the same as that of the n-type clad layer. As a result, there is an effect of increasing slope efficiency.

The features and advantages of the present invention may be summarized as follows. According to the present invention, it is possible to provide a semiconductor laser device having high power conversion efficiency.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-150741, filed on Jul. 19, 2013 including specification, claims, drawings and summary, on which the Convention priority of the present application is based, is incorporated herein by reference in its entirety.

What is claimed is:

1. A semiconductor laser device comprising:
a first conductivity type semiconductor substrate;
a first conductivity type cladding layer laminated on the semiconductor substrate;
a first light guide layer laminated on the first conductivity type cladding layer;
a first conductivity type low refractive index layer, having a lower refractive index than the refractive index of the first conductivity type cladding layer, disposed between the first conductivity type cladding layer and the first light guide layer;
an active layer laminated on the first light guide layer;
a second light guide layer laminated on the active layer; and
a second conductivity type cladding layer laminated on the second light guide layer, wherein
a higher-order mode of oscillation is supported in the semiconductor laser in crystal growth direction of the active layer,
the first light guide layer is thicker than the second light guide layer,
the refractive index of the second light guide layer is higher than the refractive index of the first light guide layer, and
the refractive index of the second conductivity type cladding layer is higher than the refractive index of the first conductivity type cladding layer.

* * * * *